(12) United States Patent
Moghe et al.

(10) Patent No.: US 7,415,719 B2
(45) Date of Patent: Aug. 19, 2008

(54) POLICY SPECIFICATION FRAMEWORK FOR INSIDER INTRUSIONS

(75) Inventors: Pratyush Moghe, Stow, MA (US); Narain Gehani, Summit, NJ (US)

(73) Assignee: Tizor Systems, Inc., Maynard, MA (US)

( * ) Notice: Subject to any disclaimer, the term of this patent is extended or adjusted under 35 U.S.C. 154(b) by 552 days.

(21) Appl. No.: 10/950,073

(22) Filed: Sep. 24, 2004

(65) Prior Publication Data

US 2005/0071644 A1   Mar. 31, 2005

Related U.S. Application Data

(60) Provisional application No. 60/506,057, filed on Sep. 26, 2003.

(51) Int. Cl.
*H04L 9/00* (2006.01)
*H04L 9/32* (2006.01)

(52) U.S. Cl. .................................. 726/1; 726/2; 726/3

(58) Field of Classification Search ................. 726/1–4, 726/22–23, 26–30
See application file for complete search history.

(56) References Cited

U.S. PATENT DOCUMENTS

| | | | |
|---|---|---|---|
| 6,275,941 B1 * | 8/2001 | Saito et al. | 726/2 |
| 6,339,830 B1 * | 1/2002 | See et al. | 726/15 |

* cited by examiner

*Primary Examiner*—Hosuk Song
(74) *Attorney, Agent, or Firm*—David H. Judson (57) ABSTRACT

The present invention provides a policy specification framework to enable an enterprise to specify a given insider attack using a holistic view of a given data access, as well as the means to specify and implement one or more intrusion mitigation methods in response to the detection of such an attack. The policy specification provides for the use of "anomaly" and "signature" attributes that capture sophisticated behavioral characteristics of illegitimate data access. When the attack occurs, a previously-defined administrator (or system-defined) mitigation response (e.g., verification, disconnect, deprovision, or the like) is then implemented.

17 Claims, 4 Drawing Sheets

| Attribute \ Dimension | Location | Time | Content | Operation | Size | Access | User |
|---|---|---|---|---|---|---|---|
| RARE | TRUE if the database is accessed from a rarely used location; otherwise, FALSE. | TRUE if the database is accessed during a rare time period; otherwise, FALSE. | TRUE if any of the tables has rarely been accessed; otherwise, FALSE. | TRUE if any of the specified operations has rarely been performed; otherwise, FALSE. | | | TRUE if the user rarely accesses the database; otherwise, FALSE. |
| NEW | TRUE if the database is accessed from a new location; otherwise, FALSE. | TRUE if the database is accessed in a new time period; otherwise, FALSE. | TRUE if any of the tables is being accessed for the first time; otherwise, FALSE. | TRUE if any of the operations is being performed for the first time; otherwise, FALSE. | | | TRUE if the user is accessing the database for the first time; otherwise, FALSE. |
| LARGE | | | | | TRUE if the size of data retrieved is large relative to size of past retrievals, otherwise, FALSE. | | |
| HIGH FREQUENCY | | | | | | TRUE if success or failure of access has high frequency otherwise, FALSE. | |

*FIG. 5*

POLICY SPECIFICATION FRAMEWORK FOR INSIDER INTRUSIONS

CROSS-REFERENCE TO RELATED APPLICATIONS

This application is based on and claims priority from Ser. No. 60/506,057 titled "Policy Specification Framework for Insider Intrusions," filed Sep. 26, 2003.

This application also is related to Ser. No. 10/780,252 titled "A Method and Apparatus to Detect Unauthorized Information Disclosure via Content Anomaly Detection" filed Feb. 17, 2004.

COPYRIGHT STATEMENT

This application includes subject matter that is protected by copyright. All rights are reserved.

BACKGROUND OF THE INVENTION

1. Technical Field

The present invention relates generally to real-time monitoring, auditing and protection of information assets in enterprise repositories such as databases, file servers, web servers and application servers.

2. Description of the Related Art

"Insider" intrusions are damaging to enterprises and cause significant corporate risk of different forms including: brand risk, corporate trade secret disclosure risk, financial risk, legal compliance risk, and operational and productivity risk. Indeed, even the specification of an insider intrusion creates challenges distinct from external intrusions, primarily because such persons have been authenticated and authorized to access the devices or systems they are attacking. Industry analysts have estimated that insider intrusions cost over $2.7 million per incident and in many cases are significantly more damaging than external intrusions by unauthorized users. As such, it is critical that if an insider intrusion is detected, the appropriate authorities must be alerted in real-time and the severity of the attack meaningfully conveyed. Additionally, because users who have complete access to the system carry out insider intrusions, it is important to have a mitigation plan that can inhibit further access once an intrusion is positively identified.

Classically, intrusion detection has been approached by classifying misuse (via attack signatures), or via anomaly detection. Various techniques used for anomaly detection include systems that monitor packet-level content and analyze such content against strings using logic-based or rule-based approaches. A classical statistical anomaly detection system that addressed network and system-level intrusion detection was an expert system known as IDES/NIDES. In general, statistical techniques overcome the problems with the declarative problem logic or rule-based anomaly detection techniques. Traditional use of anomaly detection of accesses is based on comparing sequence of accesses to historical learned sequences. Significant deviations in similarity from normal learned sequences can be classified as anomalies. Typical similarity measures are based on threshold-based comparators or non-parametric clustering classification techniques such as Hidden Markov models. While these known techniques have proven useful, content-based anomaly detection presents a unique challenge in that the content set itself can change with time, thus reducing the effectiveness of such similarity-based learning approaches.

It is also known that so-called policy languages have been used to specify FCAPS (fault-management, configuration, accounting, performance, and security) in network managements systems. For example, within the security arena, policy languages sometimes are used to specify external intrusion problems. These techniques, however, have not been adapted for use in specifying, monitoring, detecting and ameliorating insider intrusions.

In typical access management, it is also known that simple binary matching constructs have been used to characterize authorized versus unauthorized data access (e.g., "yes" if an access request is accompanied by the presence of credentials and "no" in their absence). In contrast, and as noted above, insider intrusions present much more difficult challenges because, unlike external intrusions where just packet-level content may be sufficient to detect an intrusion, an insider intrusion may not be discoverable absent a more holistic view of a particular data access. Thus, for example, generally it can be assumed that an insider has been authenticated and authorized to access the devices and systems he or she is attacking; thus, unless the behavioral characteristics of illegitimate data accesses can be appropriately specified and behavior monitored, an enterprise may have no knowledge of the intrusion let alone an appropriate means to address it.

Thus, there remains a long felt need to provide real-time monitoring, auditing and protection of information assets against attack from enterprise insiders.

BRIEF SUMMARY OF THE INVENTION

It is a general object of the invention to provide an enterprise with techniques to specify an insider attack signature, to automatically monitor for such an attack, and to take appropriate steps to mitigate damage when the attack is detected.

It is a more specific object of the invention to provide an enterprise administrator with the ability to describe disclosure-, integrity- and availability-related attacks on enterprise data repositories that may be expected to be carried out by trusted persons or other entities operating on their behalf so that monitoring and mitigation tools can protect such information assets. In an illustrative embodiment, a policy specification framework enables an administrator to describe a given insider attack easily and succinctly through a simple declarative grammar, preferably using a graphical user interface menu. The declarative grammar comprises a flexible combination of constructs that can specify simple (default) or complex insider attack definitions. After a given insider attack has been defined as a "policy," the system monitors access behavior (with respect to a given network, system, machine, device, program or process) against that policy and issues an "alert" when the policy is triggered.

It is another more specific object of the invention to respond to such an "alert" using one or more mitigation methods. In an illustrative embodiment, when an administrator specifies a given insider attack policy, he or she may also specify one or more mitigation methods to be carried out in the event of the attack. Thus, the invention contemplates a suite of one or more mitigation methods depending on the severity of the insider intrusion.

In an illustrative embodiment, the suite of mitigation methods provide powerful insider intrusion prevention. These methods include, by way of example only: user interrogation, user disconnect, and user privilege de-provisioning. In a first mitigation method, the system provides for direct or indirect user interrogation and/or validation. This technique is particularly useful, for example, when users from suspicious locations initiate intrusions and validation can ascertain if they are legitimate. If an insider intrusion is positively verified, the system then can perform a user disconnect, such as a network-level connection termination. One particular method of the user disconnect implementation involves network level TCP session termination, which causes the session to be dropped by the client or server, or both. If additional protection is required, a further mitigation technique then "de-provisions" the user. Thus, for example, if an insider intrusion is positively verified, the system can directly or indirectly modify the authorization information within centralized authorization databases or directly modify application authorization information to perform de-provisioning of user privileges. Deprovisioning of user privileges may be local (i.e., affecting only the system under attack), or it may have a global scope beyond that of the immediate application, thus preventing the intruding user from accessing corporate resources until, for example, administrative intervention has occurred. The above-described mitigation policies may be implemented independently of one another.

Thus, the present invention provides a policy specification framework to enable an enterprise to specify a given insider attack using a holistic view of the data access, as well as the means to specify and implement one or more intrusion mitigation methods in response to the detection of such an attack. The policy specification provides for the use of "anomaly" and "signature" attributes that capture sophisticated behavioral characteristics of illegitimate data access. Advantageously, these attributes capture temporal and relative changes in the properties of data access. For instance, the enterprise may specify that an anomaly attribute called "large" be evaluated on a data access property called "size" to capture large data retrieval—perhaps indicative of a bulk data theft. When the attack occurs, a previously-defined administrator (or system-defined) mitigation response (e.g., verification, disconnect, de-provision, or the like) is then implemented.

The foregoing has outlined some of the more pertinent features of the invention. These features should be construed to be merely illustrative. Many other beneficial results can be attained by applying the disclosed invention in a different manner or by modifying the invention as will be described.

DETAILED DESCRIPTION OF AN EMBODIMENT

Figure 1:
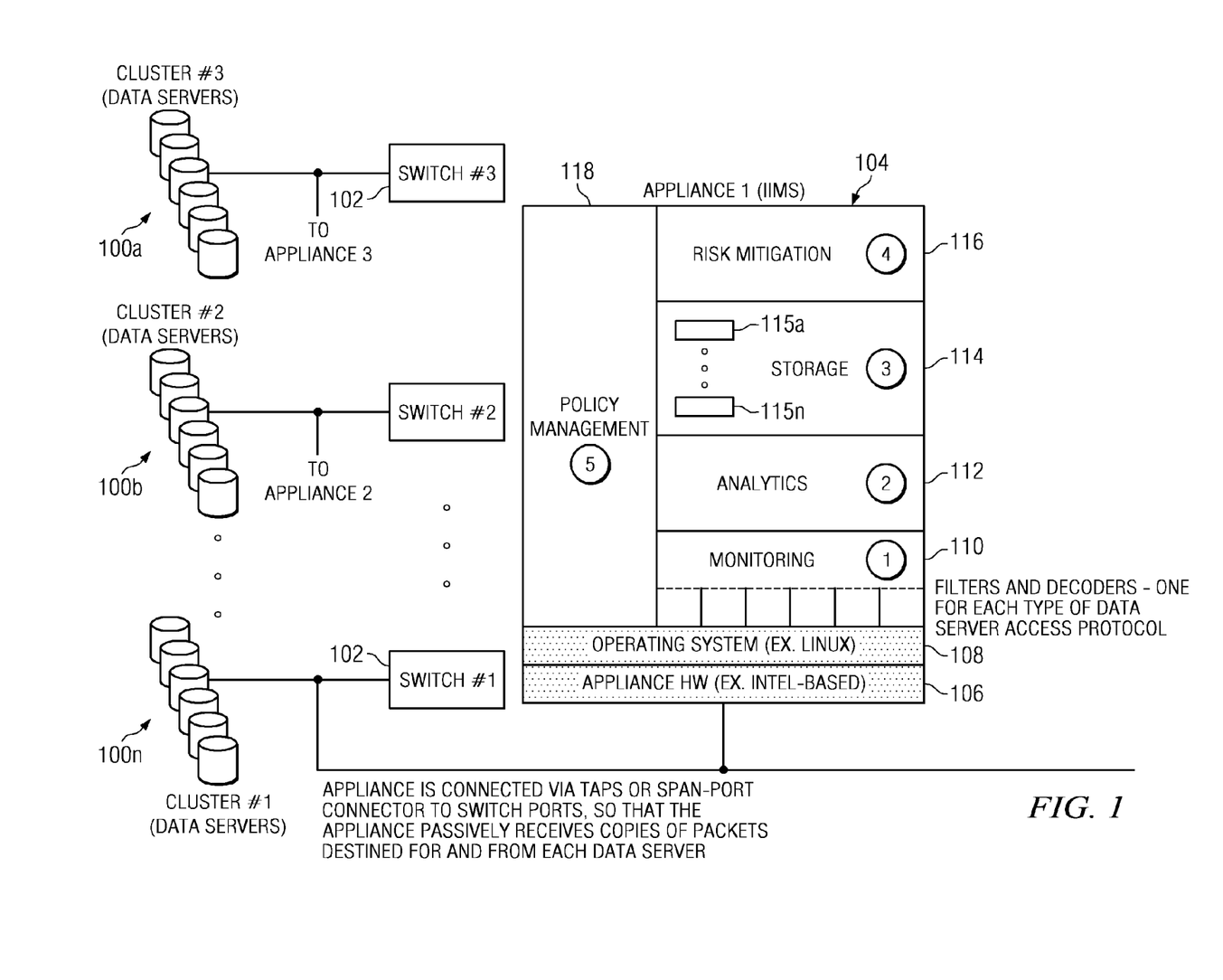
FIG. 1 illustrates a representative enterprise computing environment and a representative placement of a network-based appliance that facilitates the information auditing and protection functions of the present invention

As used herein, an "insider" is an enterprise employee, agent, consultant or other person (whether a human being or an automated entity operating on behalf of such a person) who is authorized by the enterprise to access a given network, system, machine, device, program, process, or the like, and/or one such entity who has broken through or otherwise compromised an enterprise's perimeter defenses and is posing as an insider. More generally, an "insider" can be thought of a person or entity (or an automated routine executing on their behalf) that is "trusted" (or otherwise gains trust, even illegitimately) within the enterprise. An "enterprise" should be broadly construed to include any entity, typically a corporation or other such business entity, that operates within a given location or across multiple facilities, even worldwide. Typically, an enterprise in which the present invention is implemented operates a distributed computing environment that includes a set of computing-related entities (systems, machines, servers, processes, programs, libraries, functions, or the like) that facilitate information asset storage, delivery and use. One such environment is illustrated in FIG. 1 and includes one or more clusters 100a-n of data servers connected to one or more switches 102a-n. Although not meant to be limiting, a given data server is a database, a file server, an application server, or the like, as the present invention is designed to be compatible with any enterprise system, machine, device or other entity from which a given data access can be carried out. A given cluster 100 is connected to the remainder of the distributed environment through a given switch 102, although this is not a limitation of the enterprise environment. In this illustrative embodiment, the present invention is implemented by a network-based appliance 104 that preferably sits between a given switch 102 and a given cluster 100 to provide real-time monitoring, auditing and protection of information assets in the cluster.

As also illustrated in FIG. 1, the appliance 104 is a machine running commodity (e.g., Pentium-class) hardware 106, an operating system (e.g., Linux, Windows 2000 or XP, OS-X, or the like) 108, and having a set of functional modules: a monitoring module or layer 110, an analytics module or layer 112, a storage module or layer 114, a risk mitigation module or layer 116, and a policy management module or layer 118. These modules preferably are implemented a set of applications or processes (e.g., linkable libraries, native code, or the like, depending on platform) that provide the functionality described below. More generally, unless indicated otherwise, all functions described herein may be performed in either hardware or software, or any combination thereof. In an illustrated embodiment, the functions are performed by one or more processors executing given software. The functions of the various modules as described below may be implemented in fewer than the modules disclosed or in an integrated manner, or through a central management console. Although not illustrated in detail, typically the appliance 104 also includes an application runtime environment (e.g., Java), a browser or other rendering engine, input/output devices and network connectivity. The appliance 104 may be implemented to function as a standalone product, to work cooperatively with other such appliances while centrally managed or configured within the enterprise, or to be managed remotely, perhaps as a managed service offering.

In the illustrated embodiment, the network appliance monitors the traffic between a given switch and a given cluster to determine whether a given administrator—(or system—) defined insider attack has occurred. As used herein, the phrases "insider intrusions," "access intrusion," "disclosure violations," "illegitimate access" and the like are used interchangeably to describe any and all disclosure-, integrity- and availability-related attacks on data repositories carried out by trusted roles. As is well-known, such attacks can result in unauthorized or illegitimate disclosures, or in the compromise of data integrity, or in denial of service. As already noted, the nature and type of data repositories that can be protected by the appliance include a wide variety of devices and systems including databases and database servers, file servers, web servers, application servers, other document servers, and the like (collectively, "enterprise data servers" or "data servers"). This definition also includes directories, such as LDAP directories, which are often used to store sensitive information.

Figure 2:
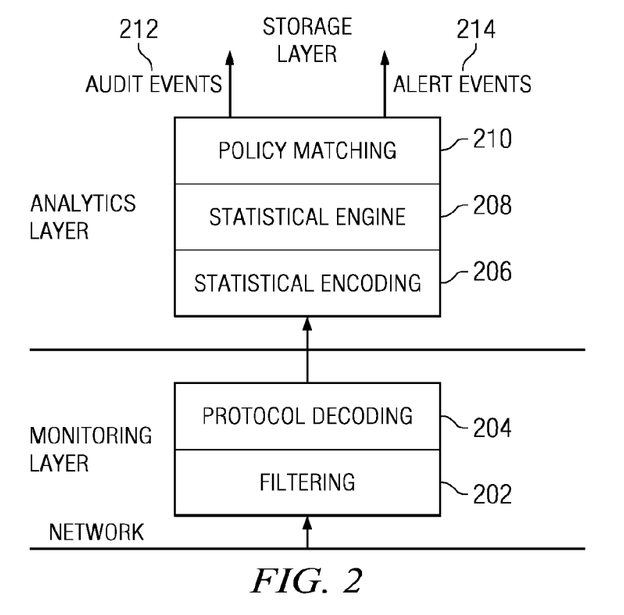
FIG. 2 is a block diagram illustrating the Monitoring and Analytics layers of the present invention.

Referring now back to FIG. 1, the first module 110 (called the monitoring layer) preferably comprises a protocol decoding layer that operates promiscuously. The protocol decoding layer typically has specific filters and decoders for each type of transactional data server whether the data server is a database of a specific vendor (e.g., Oracle versus Microsoft SQL Server) or a file server or an application server. In general, the protocol decoding layer filters and decoders extend to any type of data server to provide a universal "plug-n-play" data server support. The operation of the layer preferably follows a two-step process as illustrated in FIG. 2: filtering and decoding. In particular, a filtering layer 202 first filters network traffic, e.g., based on network-, transport-, and session-level information specific to each type of data server. For instance, in the case of an Oracle database, the filter is intelligent enough to understand session-level connection of the database server and to do session-level de-multiplexing for all queries by a single user (client) to the user. In this example, only network traffic that is destined for a specific data server is filtered through the layer, while the remaining traffic is discarded. The output of the filtering preferably is a set of data that describes the information exchange of a session along with the user identity. The second function of the monitoring layer is to decode the (for example) session-level information contained in the data server access messages. In this function 204, the monitoring layer parses the particular access protocol, for example, to identify key access commands of access. Continuing with the above example, with Oracle data servers that use SQLNet or Net8 as the access protocol, the protocol decoding layer is able to decode this protocol and identity key operations (e.g., SELECT foo from bar) between the database client and server. This function may also incorporate specific actions to be taken in the event session-level information is fragmented across multiple packets. The output of function 204 is the set of access commands intended on the specific data server.

The monitoring layer may act in other than a promiscuous mode of operation. Thus, for example, given traffic to or from a given enterprise data server may be encrypted or otherwise protected. In such case, it may be desirable to include in the monitoring layer additional code (e.g., an agent) that can be provisioned to receive and process (through the filtering and decoding steps) data feeds from other sources, such as an externally-generated log.

The monitoring layer advantageously understands the semantics of the one or more data access protocols that are used by the protected enterprise data servers. As will be described in more detail below, the policy management layer 118 implements a policy specification language that is extremely flexible in that it can support the provisioning of the inventive technique across many different kinds of data servers, including data servers that use different access protocols. Thus, for example, the policy language enables the administrator to provision policy filters (as will described) that process functionally similar operations (e.g., a "READ" Operation with respect to a file server and a "SELECT" Operation with respect to a SQL database server) even though the operations rely on different access protocols. Because the policy management layer 118 supports this flexibility, the monitoring layer 110 must likewise have the capability to understand the semantics of multiple different types of underlying data access protocols. In addition, the monitoring layer can monitor not only for content patterns, but it can also monitor for more sophisticated data constructs that are referred to herein (and as defined by the policy language) as "containers." "Containers" typically refer to addresses where information assets are stored, such as table/column containers in a database, or file/folder containers in a file server. Content "patterns" refer to specific information strings. By permitting use of both these constructs, the policy language provides significant advantages, e.g., the efficient construction of compliance regulations with the fewest possible rules. Moreover, because the monitoring layer 118 understands the semantics of the underlying data access protocols (in other words, the context of the traffic being monitored), it can enforce (or facilitate the enforcement of) such policy.

The second module 112 (called the analytics layer) implements a set of functions that match the access commands to attack policies defined by the policy management layer 118 and, in response, to generate events, typically audit events and alert events. An alert event is mitigated by one or more techniques under the control of the mitigation layer 116, as will be described in more detail below. The analytics are sometimes collectively referred to as "behavioral fingerprinting," which is a shorthand reference that pertains collectively to the algorithms that characterize the behavior of a user's information access and determine any significant deviations from it to infer theft or other proscribed activities. The following description outlines the sequential implementation of this functionality by way of example. Further details of this layer are described in Ser. No. 10/780,250, which is incorporated herein by reference.

With reference to FIG. 2, a statistical encoding function 206 translates each access operative into a compact, reversible representation. As will be described in more detail below, this representation is guided by a compact and powerful (preferably English-based) policy language grammar. This grammar comprises a set of constructs and syntactical elements that an administrator may use to define (via a simple GUI menu) a given insider attack against which a defense is desired to be mounted. In an illustrative embodiment, the grammar comprises a set of data access properties or "dimensions," a set of one or more behavioral attributes, a set of comparison operators, and a set of expressions. A given dimension typically specifies a given data access property such as (for example): "Location", "Time," "Content," "Operation," "Size," "Access" or "User." A given dimension may also include a given sub-dimension, such as Location.Hostname, Time.Hour, Content.Table, Operation.Select, Access.Failure, User.Name, and the like. A behavioral attribute as used herein typically is a mathematical function that is evaluated on a dimension of a specific data access and returns a TRUE or FALSE indication as a result of that evaluation. A convenient set of behavior attributes thus may include (for example): "Rare," "New," "Large," "High Frequency" or "Unusual," with each being defined by a given mathematical function. The grammar may then define a given "attribute (dimension)" such as Large (Size) or Rare (Content. Table), which construct is then useful in a given policy filter. For additional flexibility, the grammar may also include comparison operators to enable the administrator to define specific patterns or conditions against which to test, such as Content.Table is "Finance" or Time.Hour=20. Logical operators, such as AND, OR and the like, can then be used to build more complex attack expressions as will seen below.

A given attack expression developed using the policy management layer is sometimes referred to as a policy filter. As seen in FIG. 2, the analytics layer preferably also includes a statistical engine 208 that develops an updated statistical distribution of given accesses to a given data server (or cluster) being monitored. A policy matching function 210 then compares the encoded representations to a set of such policy filters defined by the policy management layer to determine if the representations meet the criteria set by each of the configured policies. By using the above-described grammar, policies allow criteria to be defined via signatures (patterns) or anomalies. As will be seen, anomalies can be statistical in nature or deterministic. If either signatures or anomalies are triggered, the access is classified as an event; depending on the value of a policy-driven response field, an Audit 212 and/or an Alert 214 event is generated. Audit events 212 typically are stored within the appliance (in the storage layer 114), whereas Alert events 214 typically generate real-time alerts to be escalated to administrators. Preferably, these alerts cause the mitigation layer 116 to implement one of a suite of mitigation methods.

The third module 114 (called the storage layer) preferably comprises a multi-step process to store audit events into an embedded database on the appliance. To be able to store with high performance, the event information preferably is first written into memory-mapped file caches 115a-n. Preferably, these caches are organized in a given manner, e.g., one for each database table. Periodically, a separate cache import process 117 invokes a database utility to import the event information in batches into the database tables.

The fourth module 116 (called the risk mitigation layer) allows for flexible actions to be taken in the event alert events are generated in the analytics layer. As will be described in more detail below, among the actions preferably supported by this module are user interrogation and validation, user disconnection, and user deprovisioning, which actions may occur synchronously or asynchronously, or sequence or otherwise. In a first mitigation method, the layer provides for direct or indirect user interrogation and/or validation. This technique is particularly useful, for example, when users from suspicious locations initiate intrusions and validation can ascertain if they are legitimate. If an insider intrusion is positively verified, the system then can perform a user disconnect, such as a network-level connection termination. If additional protection is required, a further mitigation technique then "de-provisions" the user. This may include, for example, user deactivation via directories and authorization, and/or user deprovisioning via identity and access management. Thus, for example, if an insider intrusion is positively verified, the system can directly or indirectly modify the authorization information within centralized authorization databases or directly modify application authorization information to perform de-provisioning of user privileges. The mitigation layer may provide other responses as well including, without limitation, real-time forensics for escalation, alert management via external event management (SIM, SEM), event correlation, perimeter control changes (e.g., in firewalls, gateways, IPS, VPNs, and the like) and/or network routing changes.

Thus, for example, the mitigation layer may quarantine a given user whose data access is suspect (or if there is a breach) by any form of network re-routing, e.g., VLAN re-routing. Alternatively, the mitigation layer (or other device or system under its control) undertakes a real-time forensic evaluation that examines a history of relevant data accesses by the particular user whose actions triggered the alert. Forensic analysis is a method wherein a history of a user's relevant data accesses providing for root-cause of breach is made available for escalation and alert. This reduces investigation time, and forensic analysis may be used to facilitate which type of additional mitigation action (e.g., verification, disconnection, de-provisioning, some combination, and so forth) should be taken in the given circumstance.

As has already been described, the fifth module 118 (called the policy management layer) interacts with all the other layers. This layer allows administrators to specify auditing and theft rules, preferably via an English-like language. The language is used to define policy filters (and, in particular, given attack expressions) that capture insider intrusions in an expressive, succinct manner. The language is unique in the sense it can capture signatures as well as behavioral anomalies to enable the enterprise to monitor and catch "insider intrusions," "access intrusions," "disclosure violations," "illegitimate accesses" "identity thefts" and the like regardless of where and how the given information assets are being managed and stored within or across the enterprise.

Figure 3:
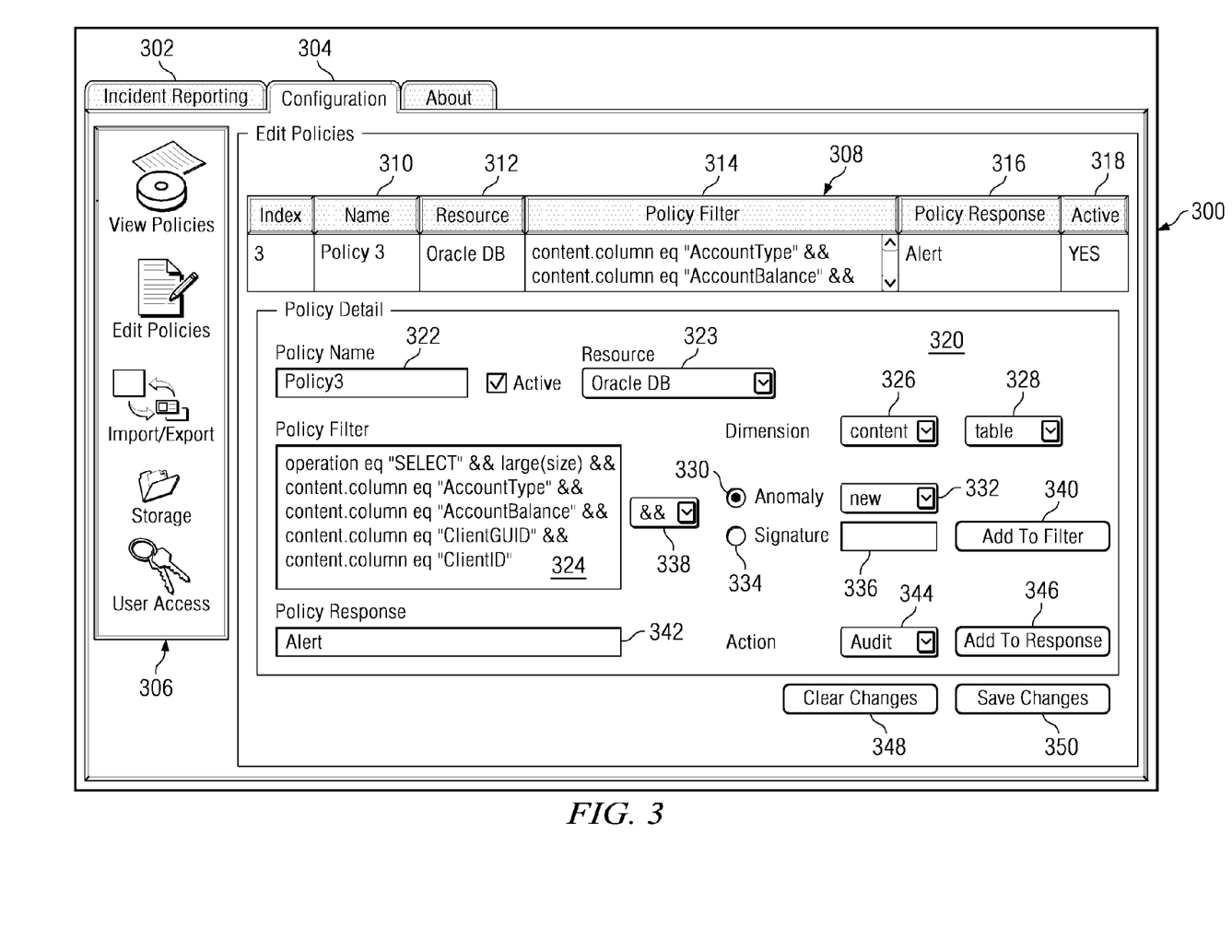
FIG. 3 illustrates a representative administrative interface for enabling the specification of a given insider attack as a policy using the invention policy specification language of the present invention.

FIG. 3 illustrates a representative user interface 300 that can be used to specify a given attack policy. This GUI is merely representative. In a representative embodiment, the GUI is exported for viewing on the network appliance 104 and/or a system management console (connectable to the appliance) is provided for this purpose. The particular location or machine from which the GUI is exposed to the administrator is not a limitation, as the GUI may be available locally or remotely. The GUI preferably includes an Incident Reporting tab 302 and a Configuration tab 304, which is illustrated. The Incident Reporting tab 302 catalogs, for example, the Audit events generated by the Monitoring layer. The Configuration tab 304 comprises a navigation bar 306 that enables the administrator to View Policies, Edit Policies, Import/Export Policies, access Storage and control User Access. The Edit Policies view is shown, as this is the menu that is used by an administrator to create and/or edit a policy. As used herein, a "policy" typically includes the policy name, metadata about the policy (e.g., name, resource protected, status, and the like), the policy filter itself, and a policy response. As seen in FIG. 3, the interface preferably includes a table 308 that displays the defined Policies indexed by number (with just one being shown). The table 308 includes fields such as a name field 310, a resource field 312, a policy filter field 314, a policy response field 316 and a field 318 indicating whether the policy is active. When a row in the table is selected, the Policy Detail is displayed in the body 320 of the menu and can be varied using conventional GUI interactivity and controls. Thus, the Policy Name can be changed by modifying the text in a fill-in field 322. The resource (e.g., a given enterprise data server, or a given enterprise data server type such as "Oracle DB") associated with the policy filter preferably is designated using a pull-down menu 323 or other such GUI control.

According to a desirable feature of the present invention, the administrator can create and/or modify a given Policy Filter in the field 324 using one or more GUI controls. Thus, for example, the administrator can specify a given dimension using the pull-down menu 326 and a given sub-dimension using the pull-down menu 328. By selecting the radio button 330 titled Anomaly, the administrator can select one of a set of behavior attributes from the pull-down menu 332. By selecting the radio button 334 titled Signature, the administrator and enter a given comparison operator in the fill-in field 336. An expression can then be created using the logical operators available from the pull-down menu 338 and the "Add To Filter" button 340. As the attack expression is developed, it is shown in the Policy Filter field 324. As also shown, the administrator can identify a response (in this case an Alert) in a Policy Response fill-in field 342 and specify the type of Action to take using the pull-down menu 344. An "Add To Response" button 346 is used to execute a change. Changes can be cleared or saved using the buttons 348 and 350.

Thus, the GUI in FIG. 3 implements the policy specification language to enable an administrator (or other authorized person or entity) to create a policy filter that is applied against a monitored data access to generate a given policy response. The policy language allows signatures of specific accesses to be defined via multiple dimensions such as Content, User, Operation, Location, Time, and Size. To be more efficient, the language also allows the Content dimension (for example) to refer to sub-dimensions such as "containers" or "patterns." As described above, "containers" typically refer to addresses where information assets are stored, whereas "patterns" refer to the actual assets themselves. The ability to monitor "containers" provides for higher throughput and better performance at lower cost.

Thus, in one example, content containers (specified as Content.container) refer to addresses where information assets are stored—such as a table/column containers in a database or file/folder containers in a file server. Content patterns refer to specific information strings that need to be monitored. By permitting use both these constructs to form a given Policy Filter, as noted above the policy language allows for efficient construction of compliance regulations for an enterprise with fewest possible rules. The policy language also allows the ability to specific behavioral anomalies, preferably via English-like anomaly constructs on different dimensions. Anomalies can be statistical or deterministic. As noted above, statistical anomalies may be specified via constructs like Large or New or Rare in conjunction with the dimension they operate on. For example, Large (Size) returns a success if the response size of a transaction is significantly larger than the past history. Deterministic anomalies may be specified by typical equality or inequality operators. For example, the operator size>X captures a deterministic anomaly in the event the response size exceeds threshold X.

Figure 4:
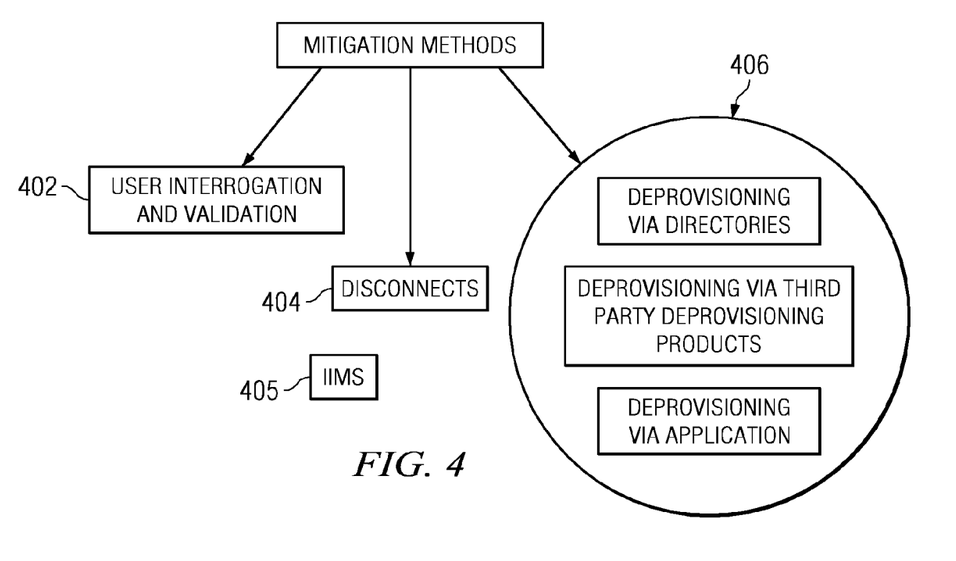
FIG. 4 illustrates a representative suite of mitigation techniques that may be implemented by an enterprise.

As noted above, the present invention provides for one or more mitigation methods as may be specified by an administrator in the GUI or otherwise. FIG. 4 illustrates a representative suite of mitigation techniques that may be implemented by an enterprise. As will be described, in one method, the mitigation layer implements direct or indirect means 402 to interrogate the user and perform an additional stage (or level) of validation (authentication) that the user access is legitimate. Interrogation has several benefits, especially in the case of masqueraders who have obtained the trusted user identity and hence authorized access to sensitive information. In such cases, interrogation can ask for an additional level of secret credentials (e.g., that are external to a conventional AAA infrastructure), which can distinguish between masqueraders and trusted users. According to the invention, interrogation can occur in real-time, or non real-time. In the former, if the user correctly authenticates in real-time, further access is permitted; otherwise other mitigation techniques such as Disconnects 404 or Deprovisioning 406 are employed to terminate the user access. In the latter case, of course, interrogation has the effect of resolving an investigation.

The following provides further details of the policy specification framework that is implemented by the Policy Management layer of the present invention. As has been described, the framework enables an enterprise administrator to address a variety of insider intrusions and disclosure violations. The policy specification framework preferably is based on a policy language called (for convenience only) IIPL (Insider Intrusion Policy Language). The present invention enables an enterprise to describe default policies (which may be considered an "attack dictionary") that capture a wide variety of insider intrusions. As noted above, the invention provides a rule-based policy specification language for specifying insider attacks that can be used to interface with a monitoring and mining engine that implements these rules.

As noted above, a desirable feature of the present invention is the ability to specify given policies that can be enforced with respect to given enterprise data servers. Using these policies, the management layer can monitor given information assets in those data sources and generate audits on select events and/or alerts with respect to given anomalous behavior. Both the monitoring and analytics layers are driven by the policy specification language in the sense that these layers understand and are based on the language. As noted above, these layers also understand the semantics of the underlying, yet often different underlying data access protocols.

A representative policy language framework that provides these and other advantages is specified in the next three subsections.

1.1 Dimensions

Data access is monitored and characterized by properties called "Dimensions". IIPL provides seven basic dimensions, namely LOCATION, TIME, CONTENT, OPERATION, SIZE, RESPONSE, and USER.

Dimensions can be made more specific by the use of "sub-dimensions". This follows the notation:

DIMENSION. SUB-DIMENSION 1.1.1 LOCATION Dimension

The LOCATION dimension describes the source address of the data access request. The specific sub-dimensions are strings of type IP address, hostname, or MAC address.

| Dimension/Sub-Dimension | Semantics |
| --- | --- |
| LOCATION | Access source address |
| LOCATION.IP | IP address of request source |
| LOCATION.HOSTNAME | Host name of request source |
| LOCATION.MAC | MAC address of request source |

1.1.2 TIME Dimension

The TIME dimension describes the time of the data access request in user-defined units. TIME can be further quantized into discrete periods such as hour of the day, and so on.

| Dimension | Semantics |
| --- | --- |
| TIME | Time of the data access request |
| TIME.HOUR | Hour of the data access request (Integer: 1 to 24) |
| TIME.DAY | Calendar day of the data access request (format DD.MM.YY) |

1.1.3 CONTENT Dimension

The CONTENT dimension describes the content of the data that is accessed. The specific sub-dimension is used to further classify content-type according to each application. For instance, in a Database application, sub-dimensions refer to names of Tables, Columns, etc. In the examples below, sub-types can be specified explicitly or implicitly. For example, a "Column" can be specified explicitly with absolute reference (as in CONTENT.TABLE.COLUMN) or implicitly in reference to a Table context. For a Fileserver data access, sub-dimensions refer to names of Files, etc. To specify an arbitrary pattern within the data retrieved, the sub-dimension PATTERN used. In general, sub-dimensions are returned as strings (encoding to be user-defined).

| Dimension/Sub-Dimension | Semantics |
|---|---|
| CONTENT | Information that is being accessed |
| CONTENT.DATABASE | Name of database being accessed. |
| CONTENT.TABLE | Name of table being accessed. |
| CONTENT.COLUMN | Name of column being accessed (implicit reference to TABLE) |
| CONTENT.FILE | Name of ile being accessed |
| CONTENT.PATTERN | Arbitrary string within payload of data being accessed |

1.1.4 OPERATION Dimension

The OPERATION dimension describes data access operations being performed.

| Dimension | Semantics |
|---|---|
| OPERATION | An operation that is being performed as part of the data access request |

For instance, in a database access, one instance of OPERATION could be a SQL command, such as SELECT, INSERT, UPDATE, DELETE, BEGIN, etc. For a file server access, OPERATION could be a file access command such as OPEN, READ, WRITE, and so on.

1.1.5 SIZE Dimension

The SIZE dimension describes the size (e.g., in KB) of the payload of retrieved data.

| Dimension | Semantics |
|---|---|
| SIZE | Size of data retrieved in KB |

1.1.6 ACCESS Dimension

The ACCESS dimension describes the access status of the data access query. When a data access request is denied (for lack of authorization), the ACCESS.FAILURE dimension returns a binary value of TRUE. When a data access request is successful, the ACCESS.SUCCESS dimension returns a binary value of TRUE.

| Dimension | Semantics |
|---|---|
| ACCESS | Status of a data access request. |
| ACCESS.FAILURE | Failure status of data access request |
| ACCESS.SUCCESS | Success status of a data access request. |

1.1.7 USER Dimension

The USER dimension describes the user initiating the data access request. A few examples of specific sub-dimensions of USER are described below.

| Dimension | Semantics |
|---|---|
| USER | User initiating the data access request. |
| USER.NAME | User name (string, encoded by configuration) |
| USER.ID | User id (string) |
| USER.ROLE | User role (as defined in $3^{rd}$ party authorization database) |

The USER dimension can be used to specify a user by identity (USER.NAME="JOHN DOE") or over the aggregate of all users (USER=ALL).

If USER dimension is not specified, it implies that policy is applied across the self-reference of each user (formally, USER=SELF).

1.2 Attributes

Attributes preferably are mathematical functions evaluated on the dimension of a specific data access. Attributes preferably return TRUE or FALSE.

Usage:
ATTRIBUTE (DIMENSION)

Allowed ATTRIBUTES include:
RARE
NEW
LARGE
HIGH FREQUENCY
UNUSUAL

Figure 5:
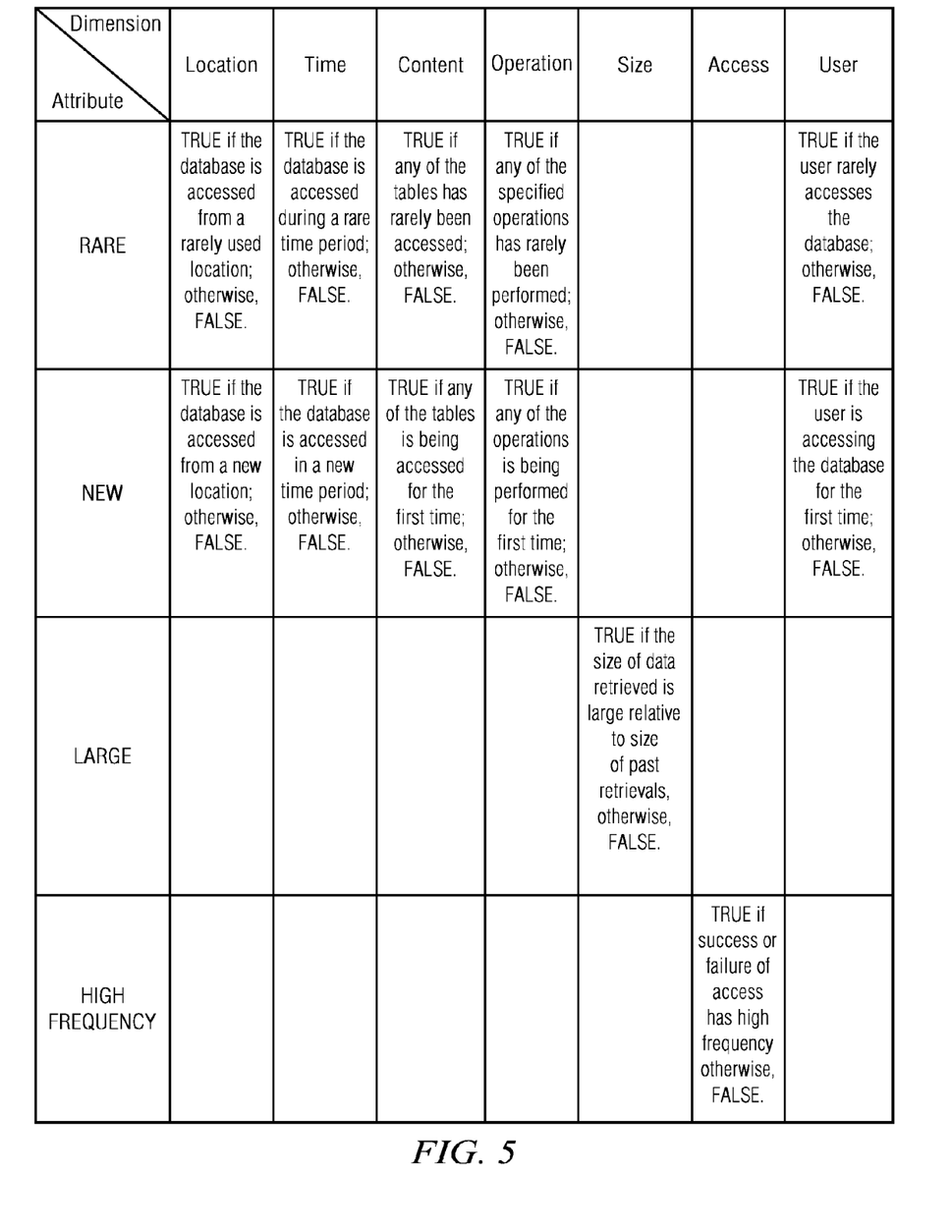
FIG. 5 illustrates how the policy specification grammar of the present invention may be used to define a set of "attribute (dimension)" relationships for use in one or more attack expressions.

The Appendix describes preferred mathematical definitions of these functions. As an illustration, consider database access. The table shown in FIG. 5 provides the semantics of attributes and the specific dimensions on which they operate in a representative embodiment of the present invention. This example is not to be taken by way of limitation, however.

1.3.1 Comparison

Comparison operators enable IIPL to detect signatures (namely, specific patterns or conditions).

The standard comparison operators (==, !=, >, >=, <, <=) can be applied to evaluate Boolean or integer expressions.

Example: TIME.HOUR==20

The string comparison operator (eq or is) and (neq) is used to compare string values.

Example: CONTENT.TABLE eq "Finance"
Example: CONTENT.TABLE neq "Orders"

The wildcard characters
*(zero or more occurrences of any character),
+(one or more occurrences of any character),
? (one character)

may be embedded in string constants for comparison purposes.

1.3.2 Logical

IIPL expressions preferably can be combined using the Boolean operators
AND,&&

Example: CONTENT.TABLE eq "Finance" && CONTENT.TABLE eq "Orders"
OR, ||

Example: OPERATION eq "Update" || OPERATION eq "Delete"

1.4 Attack Expressions

The following are some representative examples of common insider intrusions and their specification in IIPL:

| Attack | Explanation |
|---|---|
| OPERATION eq SELECT AND LARGE(SIZE) | High volume disclosure (Indicative of potential bulk theft of data relative to users's normal data access - common in identity theft, customer data theft, etc.) |
| OPERATION eq SELECT AND RARE(CONTENT.TABLE) AND CONTENT.TABLE eq "Patient Social Security" | Rare content disclosure (Triggers when a user retrieves information from "Patient Social Security" Table and this is a rare occurrence relative to this users' past accesses) |
| CONTENT.TABLE eq "Patient Social Security" AND OPERATION eq SELECT AND NEW(USER) | New Disclosure of Sensitive Content (GLBA, HIPPA) (Triggers when a sensitive content is retrieved by a new user) |
| NEW(LOCATION) AND OPERATION eq SELECT | Masquerader disclosure |
| NEW(LOCATION) AND OPERATION eq UPDATE | Masquerader compromise |
| NEW(LOCATION) AND UNUSUAL(TIME) | Masquerader access |
| RARE(OPERATION) AND OPERATION eq DELETE | Rare integrity compromise or denial of service attack |
| HIGH-FREQUENCY(ACCESS.FAILURE) AND OPERATION eq SELECT AND NEW(LOCATION) | Potential unsuccessful attempts by masquerader |
| RARE(OPERATION) AND OPERATION eq DELETE | Rare integrity compromise or denial of service attack |

The following Appendix describes the mathematical functions that may be used to generate the above-described Attributes on a given Dimension of a current data access:

1. RARE(Dimension) Function:
   {
   a. Assuming steady-state, consider all the data accesses that occurred within the past averaging time $R*\Delta$
   R and $\Delta$ are defined in configuration file.
   b. Compute the relative frequency F of occurrence of Dimension in these data accesses
   c. Identify low outliers defined by those combinations which have frequency F less than $M - K*\sigma$, where M is the sample mean of the relative frequency of all combinations, K is a constant defined in configuration file, $\sigma$ is the sample standard deviation of the relative frequency of all combinations. All transactions within such combinations are marked as rare dimension occurrences.
   If the current data access is a marked transaction, return TRUE, otherwise return FALSE.
   }
2. NEW(Dimension) Function:
   {
   a. Look at all the transactions that occurred within the past averaging time $U*\Delta$. U and $\Delta$ are defined in configuration file.
   b. If the Dimension of the current data access occurs for the first time in the past $U*\Delta$ averaging interval, mark it as a unique Dimension access and return TRUE, otherwise return FALSE.
   }
3. LARGE(SIZE) Function:
   {
   a. Look at all the transactions that occurred within the past averaging time $L*\Delta$. L and $\Delta$ are defined by configuration.
   b. If the SIZE of the current data access is > LargeSizeMultiple*largest SIZE in the past $L*\Delta$ interval, and if the SIZE of the current data access > LargeSizeThreshold, return TRUE, otherwise return FALSE.
   LargeSizeMultiple and LargeSizeThreshold (in KB) are defined by configuration.
   }
4. HIGH FREQUENCY(ACCESS.SUCCESS or ACCESS.FAILURE) Function:
   {
   a. Look at all the transactions that occurred within the past averaging time $H*\Delta$. H and $\Delta$ are defined by configuration.
   b. If aggregate ACCESS.SUCCESS count of current data access and past data accesses is > SuccessfulAccessMultiple *average number of ACCESS.SUCCESS events over the previous K $H*\Delta$ intervals, and if aggregate ACCESS.SUCCESS count of current data access and past data accesses is > SuccessfulAccessThreshold, return TRUE, otherwise return FALSE.
   SuccessfulAccessThreshold (integer) and SuccessfulAccessMultiple(integer) are defined by configuration.
   c. If aggregate ACCESS.FAILURE count of current data access and past data accesses is > FailedAccessMultiple *average number of ACCESS.FAILURE events over the previous K $H*\Delta$ intervals, and if aggregate ACCESS.FAILURE count of current data access and past data accesses is > FailureAccessThreshold, return TRUE, otherwise -continued

```
        return FALSE.
        FailureAccessThreshold (integer) and FailureAccessMultiple(integer) are
        defined by configuration.
        }
5. UNUSUAL (DIMENSION) Function:
    {
        a. Consider a set called S_dimension. S_dimension is specified by
           configuration or constructed dynamically by assigning a closeness
           function to DIMENSION values seen in past accesses over U*Δ (both
           configured). This set is called an unusual set.
           Example: if DIMENSION is TIME.HOUR, S_dimension can be the
           off-hours set of {6pm-8am}.
        b. If the DIMENSION of current data access falls in the set S_dimension,
           return TRUE otherwise return FALSE.
    }
```

Typically, given software code (a set of instructions) is provided for implementing the above functions.

Variants

While the present invention has been described in the context of one or more representative embodiments, this is not a limitation of the invention.

The functions of the particular layers described above may be implemented in any given system, device, program or process.

It is not required that an enterprise use IIPL to generate Policy Filters. An enterprise may simply implement a given IIMS (or some function thereof) against a predefined set of Policy Filters as opposed to creating them using the GUI.

As has been described, the IIMS may be implemented with only one type of mitigation method as opposed to the multiple techniques described above. If multiple techniques are used, they need not be implemented in any given sequence. Two or more mitigation techniques may be carried out concurrently. A given mitigation technique may be used for one user while a second technique used for another, even when the access patterns are similar. A given mitigation technique may be implemented in ways other than as described above.

The IIPL functionality may be implemented separate and apart from the IIMS functionality, of course.

A given appliance that implements the present invention may be operated in other than promiscuous mode. In particular, the monitoring layer (or other discrete functionality in the appliance) can be provided to receive and process external data feeds (such as a log of prior access activity) in addition to (or in lieu of) promiscuous or other live traffic monitoring.

A given function in the appliance may be implemented across multiple such appliances, or under the control of a management console.

The GUI illustrated in FIG. 3 may be modified in any convenient manner. The functions may be specified using other known techniques, such as a command line interface.

More generally, although the present invention has been described in the context of a method or process, the present invention also relates to apparatus for performing the operations herein. As described above, this apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including an optical disk, a CD-ROM, a magnetic-optical disk, a read-only memory (ROM), a random access memory (RAM), a magnetic or optical card, or any type of media suitable for storing electronic instructions, and each coupled to a computer system bus.

While the above written description also describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

The present invention has several important characteristics and advantages. IIPL provides a comprehensive method to describe insider access intrusions. It provides a flexible combination of constructs such as dimensions, anomaly operators and patterns called indicators. These constructs allow the succinct modeling of a wide variety of insider access attacks. IIPL allows an English-like specification similar to the behavioral description of an insider access attack. By using constructs that are similar to the behavioral attributes, IIPL allows operators to easily map existing attack behavioral knowledge into an IIPL specification. This has an added advantage of avoiding operator errors. IIPL is a rule-based language that allows the definition of a policy framework for insider intrusions. Because operators are comfortable using policy frameworks for other types of security infractions, IIPL is a natural add-on to existing security systems within the enterprise. IIPL allows a combinational logic across dimensions (characteristics) of an attack and operators. This also permits easy tuning and false positive management. For instance, adding additional dimensions in describing an attack can reduce false positives, while reducing dimensions can increase the detection rate of potential attacks.

The present invention is capable of monitoring even the largest data center, without interrupting the flow of information to users. It not only recognizes the behavioral changes that signal danger to an enterprise's critical data assets, but it also creates a comprehensive audit trail that will satisfy even the strictest privacy and compliance regulations. The present invention is easy to deploy and use, scalable, affordable and it meets the needs of any organization with critical data to protect.

Having described our invention, what we claim is as follows.

We claim:

1. A method of protecting enterprise information assets against insider attacks, comprising:

specifying a set of one or more policy filters, wherein a given policy filter specifies an insider attack and is associated with a given enterprise data server type and defines (a) a given action that a trusted user may attempt to take with respect to a given enterprise information asset stored on a given enterprise data server, and (b) a given response that is to be taken upon detection of the given action;

determining whether a trusted user's given data access is indicative of a given action as specified by a given policy filter in the set of policy filters; and if the trusted user's given data access is indicative of a given action as specified by the given policy filter, taking the given response specified by the policy filter.

2. The method as described in claim 1 wherein a policy filter is specified using a given behavioral attribute evaluated on a given data access property.

3. The method as described in claim 2 wherein the given data access property is selected from a set of dimensions that include: Location, Time, Content, Operation, Size, Access and User.

4. The method as described in claim 3 wherein a given dimension includes a given sub-dimension that further defines the data access property.

5. The method as described in claim 2 wherein the given behavioral attribute is selected from a set of signature or anomaly attributes.

6. The method as described in claim 1 wherein a given policy filter includes at least one logical expression.

7. The method as described in claim 1 wherein the given response generates an audit event.

8. The method as described in claim 1 wherein the given response generates an alert event.

9. The method as described in claim 1 wherein the trusted user's given data access is monitored for given content patterns as defined by the policy filter.

10. The method as described in claim 1 wherein the trusted user's given data access is monitored for given content containers as defined by the policy filter.

11. A method of protecting an enterprise information asset against insider attack, comprising:

specifying an insider attack policy filter that defines a given action that a trusted user may attempt to take with respect to a given enterprise information asset stored on a given enterprise data server, wherein the insider attack policy filter conforms to a given policy specification language;

monitoring a trusted user's given data access with respect to the given enterprise data server;

analyzing the given data access against the insider attack policy filter;

determining whether the trusted user's given data access is indicative of the given action as specified by the insider attack policy filter;

if the trusted user's given data access is indicative of the given action as specified in the insider attack policy filter, taking a given action.

12. The method as described in claim 11 wherein the trusted user's given data access is monitored for a given content pattern as defined by the insider attack policy filter.

13. The method as described in claim 11 wherein the trusted user's given data access is monitored for a given content container as defined by the insider attack policy filter.

14. The method as described in claim 11 wherein the given action initiates an attack mitigation to protect the given enterprise information asset.

15. The method as described in claim 11 wherein the given action stores an audit event.

16. A system for protecting an enterprise information asset against insider attack, comprising:

at least one processor: and code executing on a processor for generating a display interface through which an authorized entity using a given policy specification language specifies an insider attack, wherein the given policy specification language enables the authorized entity to specify at least insider attack policy filter that is associated with a given enterprise data server type and defines(a) a given action that a trusted user may attempt to take with respect to a given enterprise information asset stored on a given enterprise data server, and (b) a given response that is to be taken upon detection of the given action.

17. The system as described in claim 16 further include code for executing on a processor for enforcing the insider attack policy filter with respect to a given enterprise data server.

* * * * *